United States Patent
Bergman et al.

(10) Patent No.: US 6,817,370 B2
(45) Date of Patent: Nov. 16, 2004

(54) METHOD FOR PROCESSING THE SURFACE OF A WORKPIECE

(75) Inventors: Eric J. Bergman, Kalispell, MT (US); Mignon P. Hess, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/420,659

(22) Filed: Apr. 21, 2003

(65) Prior Publication Data

US 2003/0205254 A1 Nov. 6, 2003

Related U.S. Application Data

(63) Continuation of application No. 09/677,925, filed on Oct. 3, 2000, now Pat. No. 6,591,845, which is a division of application No. 09/061,318, filed on Apr. 16, 1998, now abandoned, which is a continuation-in-part of application No. 08/853,649, filed on May 9, 1997, now Pat. No. 6,240,933.

(51) Int. Cl.$^7$ .................................................. B08B 3/10
(52) U.S. Cl. ................. 134/105; 134/102.1; 134/102.3; 134/902; 134/148; 134/153
(58) Field of Search ................................ 134/105, 107, 134/102.1, 102.3, 902, 186, 148, 153

(56) References Cited

U.S. PATENT DOCUMENTS

| | | | |
|---|---|---|---|
| 4,186,032 A | * | 1/1980 | Ham |
| 4,695,327 A | | 9/1987 | Grebinski |
| 4,749,440 A | | 6/1988 | Blackwood et al. |
| 4,817,652 A | | 4/1989 | Liu et al. |
| 4,917,123 A | | 4/1990 | McConnell et al. |
| 4,974,530 A | | 12/1990 | Lyon |
| 5,032,218 A | * | 7/1991 | Dobson |
| 5,055,138 A | | 10/1991 | Slinn |
| 5,063,609 A | * | 11/1991 | Lorimer |
| 5,105,556 A | | 4/1992 | Kurokawa et al. |

(List continued on next page.)

FOREIGN PATENT DOCUMENTS

| | | |
|---|---|---|
| EP | 0 344 764 | 12/1989 |
| EP | 0 548 596 | 6/1993 |
| EP | 0 702 399 | 3/1996 |
| EP | 0 782 177 | 7/1997 |
| GB | 2 287 827 | 9/1995 |
| JP | 52-12063 | 4/1977 |
| JP | 54-034751 | 3/1979 |
| JP | S61-004232 | 1/1986 |
| JP | 64-008630 | 1/1989 |
| JP | 01-179327 | 7/1989 |
| JP | 01-189921 | 7/1989 |
| JP | 03-041729 | 2/1991 |
| JP | 4-125927 | * 4/1992 |
| JP | 04-302144 | 10/1992 |
| JP | 04-302145 | 10/1992 |
| JP | 5-13398 | * 1/1993 |
| JP | 5-109686 | * 4/1993 |
| JP | 5-259139 | * 10/1993 |
| JP | 07-159980 | 6/1995 |
| WO | WO 99/52654 | 10/1999 |

OTHER PUBLICATIONS

European Patent Office 548,596 Jun. 1993.*
European Patent Office 782,177 Jul. 1997.*

*Primary Examiner*—Frankie L. Stinson
(74) *Attorney, Agent, or Firm*—Perkins Coie LLP

(57) ABSTRACT

An apparatus for supplying a mixture of a treatment liquid and ozone for treatment of a surface of a workpiece, and a corresponding method are set forth. The preferred embodiment of the apparatus comprises a liquid supply line that is used to provide fluid communication between a reservoir containing the treatment liquid and a treatment chamber housing the workpiece. A heater is disposed to heat the workpiece, either directly or indirectly. Preferably, the workpiece is heated by heating the treatment liquid that is supplied to the workpiece. One or more nozzles accept the treatment liquid from the liquid supply line and spray it onto the surface of the workpiece while an ozone generator provides ozone into an environment containing the workpiece.

26 Claims, 6 Drawing Sheets

U.S. PATENT DOCUMENTS

| | | | |
|---|---|---|---|
| 5,120,370 A | * | 6/1992 | Mori et al. |
| 5,181,985 A | | 1/1993 | Lampert et al. |
| 5,232,511 A | | 8/1993 | Bergman |
| 5,234,540 A | | 8/1993 | Grant et al. |
| 5,235,995 A | | 8/1993 | Bergman et al. |
| 5,244,000 A | | 9/1993 | Stanford et al. |
| 5,248,380 A | | 9/1993 | Tanaka |
| 5,308,745 A | | 5/1994 | Schwartzkopf |
| 5,326,406 A | | 7/1994 | Kaneko et al. |
| 5,366,757 A | | 11/1994 | Lin |
| 5,378,317 A | | 1/1995 | Kashiwase et al. |
| 5,415,191 A | | 5/1995 | Mashimo et al. |
| 5,464,480 A | | 11/1995 | Matthews |
| 5,503,708 A | * | 4/1996 | Koizumi et al. |
| 5,520,744 A | | 5/1996 | Fujikawa et al. |
| 5,571,367 A | * | 11/1996 | Nakajima et al. |
| 5,632,847 A | | 5/1997 | Ohno et al. |
| 5,647,386 A | | 7/1997 | Kaiser |
| 5,658,615 A | | 8/1997 | Hasebe et al. |
| 5,705,089 A | | 1/1998 | Sugihara et al. |
| 5,714,203 A | | 2/1998 | Schellenberger et al. |
| 5,762,755 A | | 6/1998 | McNeilly et al. |
| 5,776,296 A | | 7/1998 | Matthews |
| 5,803,982 A | | 9/1998 | Kosofsky et al. |
| 5,832,177 A | | 11/1998 | Shinagawa et al. |
| 5,858,107 A | | 1/1999 | Chao et al. |
| 5,896,875 A | * | 4/1999 | Yoneda |
| 5,911,837 A | | 6/1999 | Matthews |
| 5,944,907 A | | 8/1999 | Ohmi |
| 5,950,643 A | | 9/1999 | Miyazaki et al. |
| 5,964,952 A | | 10/1999 | Kunze-Concewitz |
| 5,968,374 A | * | 10/1999 | Bullock |
| 5,971,368 A | | 10/1999 | Nelson et al. |
| 6,146,469 A | | 11/2000 | Toshima |
| 6,299,696 B2 | | 10/2001 | Kamikawa et al. |
| 6,551,409 B1 | * | 4/2003 | DeGendt et al. ............... 134/2 |

\* cited by examiner

METHOD FOR PROCESSING THE SURFACE OF A WORKPIECE

This application is a Continuation of U.S. patent application Ser. No. 09/677,925 filed Oct. 3, 2000, and now U.S. Pat. No. 6,591,845, which is a Division of U.S. patent application Ser. No. 09/061,318 filed Apr. 16, 1998, and now abandoned, which is a Continuation-in-Part of U.S. patent application Ser. No. 08/853,649 filed May 9, 1997, now U.S. Pat. No. 6,240,933.

BACKGROUND OF THE INVENTION

The importance of clean semiconductor workpiece surfaces in the fabrication of semiconductor microelectronic devices has been recognized for a considerable period of time. Over time, as VLSI and ULSI silicon circuit technology has developed, the cleaning processes have gradually become a particularly critical step in the fabrication process. It has been estimated that over 50% of the yield losses sustained in the' fabrication process are a direct result of workpiece contaminants. Trace impurities, such as sodium ions, metals, and particles, are especially detrimental if present on semiconductor surfaces during high-temperature processing because they may spread and diffuse into the semiconductor workpiece and thereby alter the electrical characteristics of the devices formed in the workpiece. Similar requirements are placed on other such items in the electronics industry, such as in the manufacture of flat panel displays, hard disk media, CD glass, and other such workpieces.

Cleaning of a semiconductor workpiece, and other electronic workpieces, occurs at many intermediate stages of the fabrication process. Cleaning of the workpiece is often critical after, for example, photoresist stripping and/or ashing. This is particularly true where the stripping and/or ashing process immediately proceeds a thermal process. Complete removal of the ashed photoresist or the photoresist/stripper is necessary to insure the integrity of subsequent processes.

The actual stripping of photoresist from the workpiece is yet another fabrication process that is important to integrated circuit yield, and the yield of other workpiece types. It is during the stripping process that a substantial majority of the photoresist is removed or otherwise disengaged from the surface of the semiconductor workpiece. If the stripping agent is not completely effective, photoresist may remain bonded to the surface. Such bonded photoresist may be extremely difficult to remove during a subsequent cleaning operation—and thereby impact the ability to further process the workpiece.

Various techniques are used for stripping photoresist from the semiconductor workpiece. Mixtures of sulfuric acid and hydrogen peroxide at elevated temperatures are commonly used. However, such mixtures are unsuitable for stripping photoresist from wafers on which metals, such as aluminum or copper, have been deposited. This is due to the fact that such solutions will attack the metals as well as the photoresist. Solvent chemistries are often used after metal layers have been deposited. In either case, limited bath life, expensive chemistries, and high waste disposal costs have made alternative strip chemistries attractive.

Plasma stripping systems provide such an alternative and have been used for stripping both pre- and post-metal photoresist layers. This stripping technique, however, does not provide an ideal solution due to the high molecular temperatures generated at the semiconductor workpiece surface. Additionally, since photoresist is not purely a hydrocarbon (i.e., it generally contains elements other than hydrogen and carbon), residual compounds may be left behind after the plasma strip. Such residual compounds must then be removed in a subsequent wet clean.

Ozone has been used in various applications in the semiconductor industry for a number of years. Often, the ozone is combined with deionized water to form an effective treatment solution. The attractive features of such a solution include low-cost, repeatable processing, minimal attack on underlying device layers, and the elimination of waste streams that must be treated before disposal. The main drawback with. using such solutions has been the slow reaction rates that translate into long process times and flow throughput.

Photoresist strip using ozone dissolved in water has been somewhat more successful in achieving viable process rate at acceptable process temperatures. However, ozone, like all gases, has a limited solubility in aqueous solutions. At temperatures near ambient, ozone saturation occurs at around 20 ppm. Ozone solubility in water increases dramatically with decreasing temperature, to a maximum of a little over 100 ppm at temperatures approaching 0 degrees Celsius and drops to almost zero at temperatures approaching 60 degrees Celsius. While increasing ozone concentration increases the kinetic reaction rate, a decrease in temperature simultaneously suppresses that rate.

A technique for stripping photoresist and/or cleaning a semiconductor workpiece using ozone and deionized water is set forth in U.S. Pat. No. 5,464,480, titled "Process and Apparatus for the Treatment of Semiconductor Wafers in a Fluid", issued Nov. 7, 1995. The '480 patent purports to set forth a method and apparatus in which low-temperature deionized water is ozonated by bubbling ozone through the low-temperature water. The low-temperature, ozonated, deionized water is in the form of a bath. Semiconductor wafers are batch processed by immersing the wafers in the bath, for example, to clean the wafers, strip photoresist, etc.

The present inventors have found that the foregoing system purportedly described in the '480 patent may not be optimal for use in many circumstances. Static boundary regions between the bath and the surface of the semiconductor workpiece may result in sub-optimal cleaning and/or stripping. Finally, ozone concentration in the deionized water bath may be difficult to maintain in view of the fact that the apparatus of the '480 patent is an open atmospheric system.

BRIEF SUMMARY OF THE INVENTION

An apparatus for supplying a mixture of a treatment liquid and ozone for treatment of a surface of a workpiece, such as a semiconductor workpiece, and a corresponding method are set forth. The preferred embodiment of the apparatus comprises a liquid supply line that is used to provide fluid communication between a reservoir containing the treatment liquid and a treatment chamber housing the semiconductor workpiece. A heater is disposed to heat the workpiece, either directly or indirectly. Preferably, the workpiece is heated by heating the treatment liquid that is supplied to the workpiece. One or more nozzles accept the treatment liquid from the liquid supply line and spray it onto the surface of the workpiece while an ozone generator provides ozone into an environment containing the workpiece.

Generally, a heated treatment liquid is ill suited for dissolving ozone therein. As such, a thick boundary layer of treatment fluid disposed on the surface of the workpiece may act to inhibit the ability of the ozone to reach and react with the components that are, for example, to be removed from the surface of the workpiece. The apparatus therefore preferably includes one or more processing components that are used to control the thickness of the boundary layer of the heated treatment liquid on the surface of the workpiece. Reducing the thickness of the boundary layer facilitates diffusion of the ozone through the boundary layer to the surface of the workpiece. Significantly increased cleaning and stripping rates have been observed in such an apparatus, particularly when the treatment liquid is a water-containing liquid such as deionized water.

In accordance with a preferred method for treating a workpiece, the workpiece is first heated. A treatment liquid is provided to the surface of the workpiece that is to be treated and an amount of ozone is introduced into an environment containing the workpiece. Even more preferably, the thickness of a liquid boundary layer on the surface of the semiconductor workpiece is controlled to allow diffusion of the ozone therethrough so that the ozone may react at the surface of the workpiece.

In accordance with yet another embodiment of the apparatus, the apparatus comprises a liquid reservoir having a liquid chamber, a pump having an input in fluid communication with the liquid chamber and an output in fluid communication with one or more nozzles disposed to spray fluid therefrom onto the surface of the workpiece. A fluid path extends between the output of the pump and the nozzle and carries the pressurized liquid that is provided at the output of the pump. An ozone supply system injects ozone into the fluid path. As such, a pressurized mixture-of treatment liquid and ozone is sprayed onto the surface of the semiconductor workpiece to thereby eliminate many of the problems associated with prior systems. A method for treating a workpiece in the manner exercised by the foregoing apparatus system is also disclosed.

DETAILED DESCRIPTION OF THE INVENTION

Figure 1:
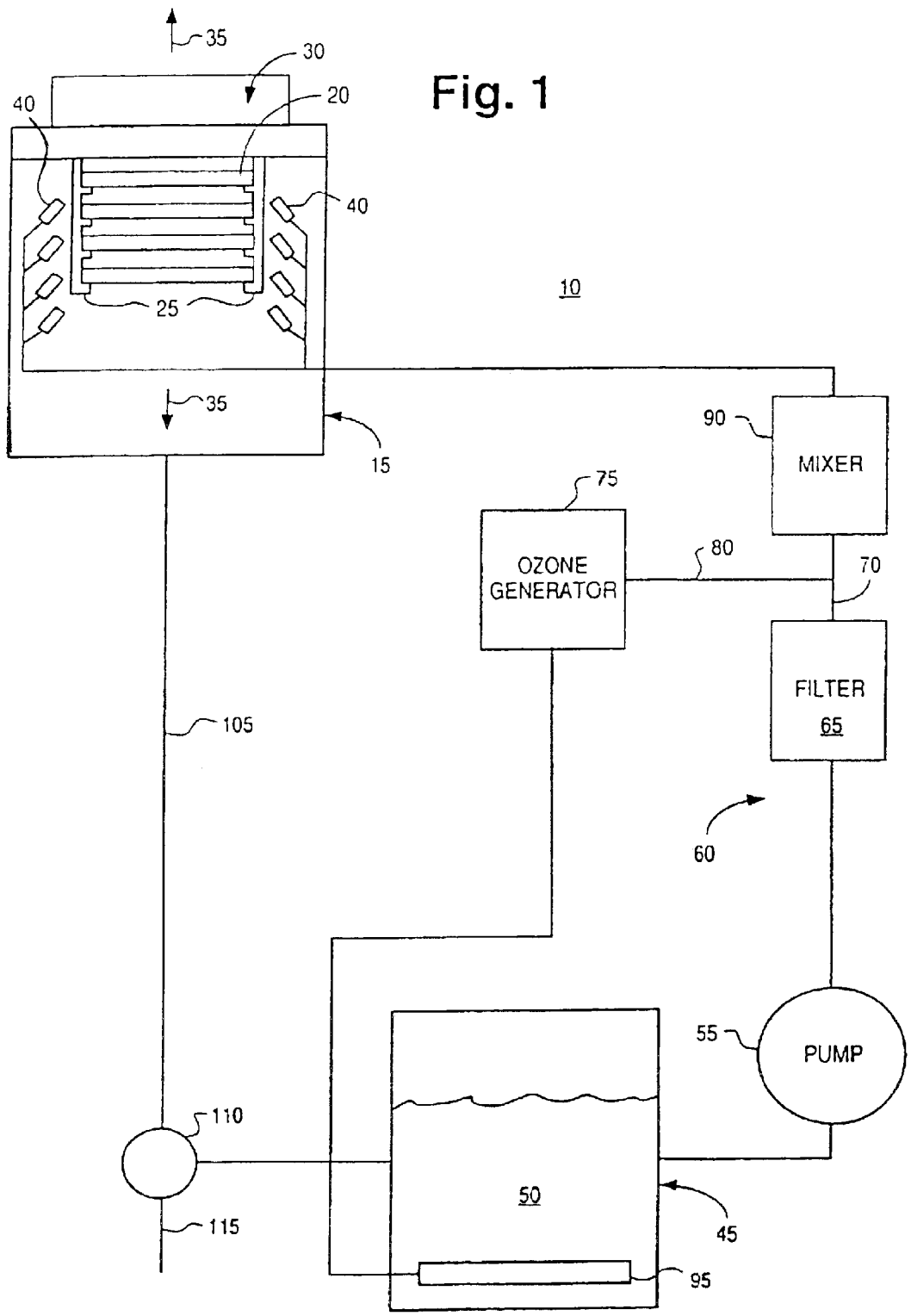
FIG. 1 is a schematic block diagram of one embodiment of an apparatus for treating a semiconductor workpiece in which ozone is injected into a line containing a pressurized treatment liquid.

One embodiment of an apparatus suitable for providing ozone and a treatment liquid for treatment of a semiconductor workpiece is illustrated in FIG. 1. The treatment system, shown generally at 10, includes a treatment chamber 15 that contains one or more workpieces 20, such as semiconductor wafer workpieces. Although the illustrated system is directed to a batch workpiece apparatus, it will be recognized that the system is readily adaptable for use in single workpiece processing as well.

The semiconductor workpieces 20 are supported within the chamber 15 by one or more supports 25 extending from, for example, a rotor assembly 30. Rotor assembly 30 seals with the housing of the treatment chamber 15 to form a sealed, closed processing environment. Further, rotor assembly 30 is provided so that the semiconductor workpieces 20 may be spun about axis 35 during or after treatment with the ozone and treatment liquid.

One or more nozzles 40 are disposed within the treatment chamber 15 so as to direct a spray mixture of ozone and' treatment liquid onto the surfaces of the semiconductor workpieces 20 that are to be treated. In the illustrated embodiment, the nozzles 40 direct a spray of treatment fluid to the underside of the semiconductor workpieces 20. However, it will be recognized that the fluid spray may be directed alternatively, or in addition, to the upper surface of the semiconductor workpieces 20.

Treatment liquid and ozone are supplied to the nozzles 40 with the assistance of a number of system components that are uniquely arranged to provide a single fluid line comprising ozone mixed with the treating liquid. To this end, a reservoir 45 defines a chamber 50 in which the liquid that is to be mixed with the ozone is stored. The chamber 50 is in fluid communication with the input of a pump mechanism 55. The pump mechanism 55 provides the liquid under pressure along a fluid flow path, shown generally at 60, for ultimate supply to the input of the nozzles 40. The preferred treatment fluid is deionized water, but it will be recognized that other treatment fluids, such as other aqueous or non-aqueous solutions, may also be employed.

A number of components are disposed along the fluid flow path 60. First, a filter 65 is disposed along the fluid flow path 60 to filter out microscopic contaminants from the treatment fluid. The treatment fluid, still under pressure, is provided at the output of the filter 65 along fluid flow line 70. It is along fluid flow line 70 that ozone is injected. The ozone is generated by ozone generator 75 and is supplied along fluid flow line 80 under pressure to fluid flow line 70. Optionally, the treatment liquid, now injected with ozone, is supplied to the input of a mixer 90 that mixes the ozone and the treatment liquid. The mixer 90 may be static or active. From the mixer 90, the treatment liquid and ozone are provided to be input of nozzles 40 which, in turn, spray the liquid on the surface of the semiconductor workpieces 20 that are to be treated and, further, introduce the ozone into the environment of the treatment chamber 15.

To further concentrate the ozone in the treatment liquid, an output of the ozone generator 75 may be supplied to a dispersion unit 95 disposed in the liquid chamber 50 of the reservoir 45. The dispersion unit 95 provides a dispersed flow of ozone through the treatment liquid to thereby add ozone to the fluid stream prior to injection of a further amount of ozone along the fluid path 60.

In the embodiment of the system of FIG. 1, spent liquid in chamber 15 is provided along fluid line 105 to, for example, a valve mechanism 110. The valve mechanism 110 may be operated to provide the spent liquid to either a drain output 115 or back to the liquid chamber 50 of the reservoir 45. Repeated cycling of the treatment liquid through the system and back to the reservoir 45 assists in elevating the ozone concentration in the liquid through repeated ozone injection and/or ozone dispersion.

Figure 2:
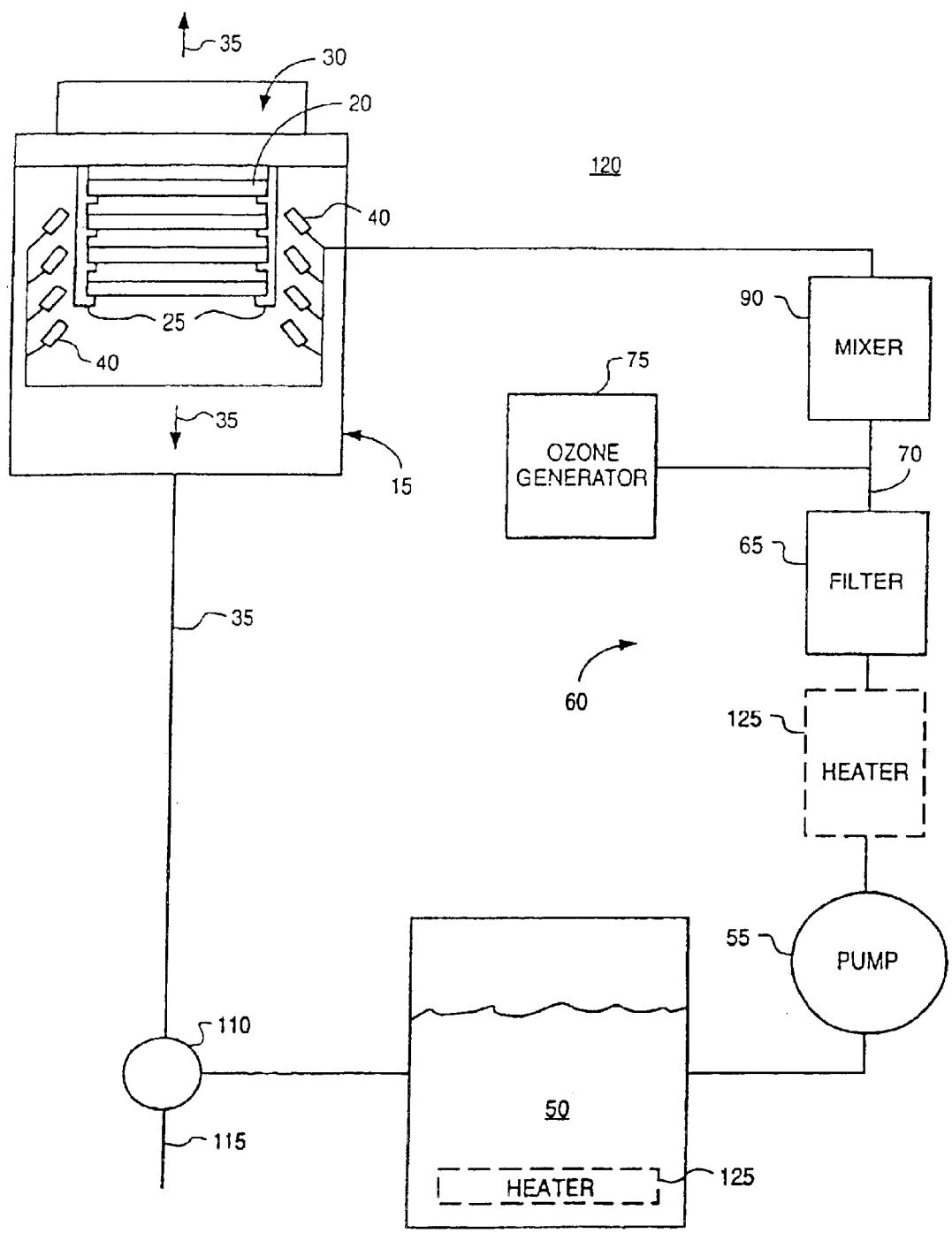
FIG. 2 is a schematic block diagram of one embodiment of an apparatus for treating a semiconductor workpiece in which the semiconductor workpiece is indirectly heated by heating a treatment liquid that is sprayed on the surface of the workpiece.

A further embodiment of a system for delivering a fluid mixture for treating the surface of a semiconductor workpiece is illustrated in FIG. 2. Although the system 120 of FIG. 2 appears to be substantially similar to the system 10 of FIG. 1, there are significant differences. The system 120 of FIG. 2 is based upon the recognition by the present inventors that the heating of the surfaces of the semiconductor workpieces 20 with a heated liquid that is supplied along with a flow of ozone that creates an ozonated atmosphere is highly effective in photoresist stripping, ash removal, and/or cleaning processes. As such, system 120 includes one or more heaters 125 that are used to heat the treatment liquid so that it is supplied to the surfaces of the semiconductor workpieces at an elevated temperature that accelerates the surface reactions. It will be recognized that it is also possible to directly heat the workpieces so as to stimulate the reactions. Such heating may take place in addition to or instead of the indirect heating of the workpieces through contact with the heated treatment liquid. For example, supports 25 may include heating elements that may be used to heat the workpieces 20. The chamber 15 may include a heater for elevating the temperature of the chamber environment and workpieces.

As noted above, the preferred treatment liquid is deionized water since it is believed to be required to initiate the cleaning/removal reactions at the workpiece surface, probably through hydrolysis of the carbon-carbon bonds of organic molecules. The present inventors, however, recognize that significant amounts of water can form a continuous film on the semiconductor workpiece surface. This film acts as a diffusion barrier to the ozone, thereby inhibiting reaction rates. Control of the boundary layer thickness, as will be explained in further detail below, is implemented by control of the rpm of the semiconductor workpiece, vapor delivery, and controlled spraying of the treatment liquid, or a combination of one or more of these techniques. By reducing the boundary layer thickness, the ozone is allowed to diffuse to the surface of the workpieces and react with the organic materials that are to be removed.

Figure 3:
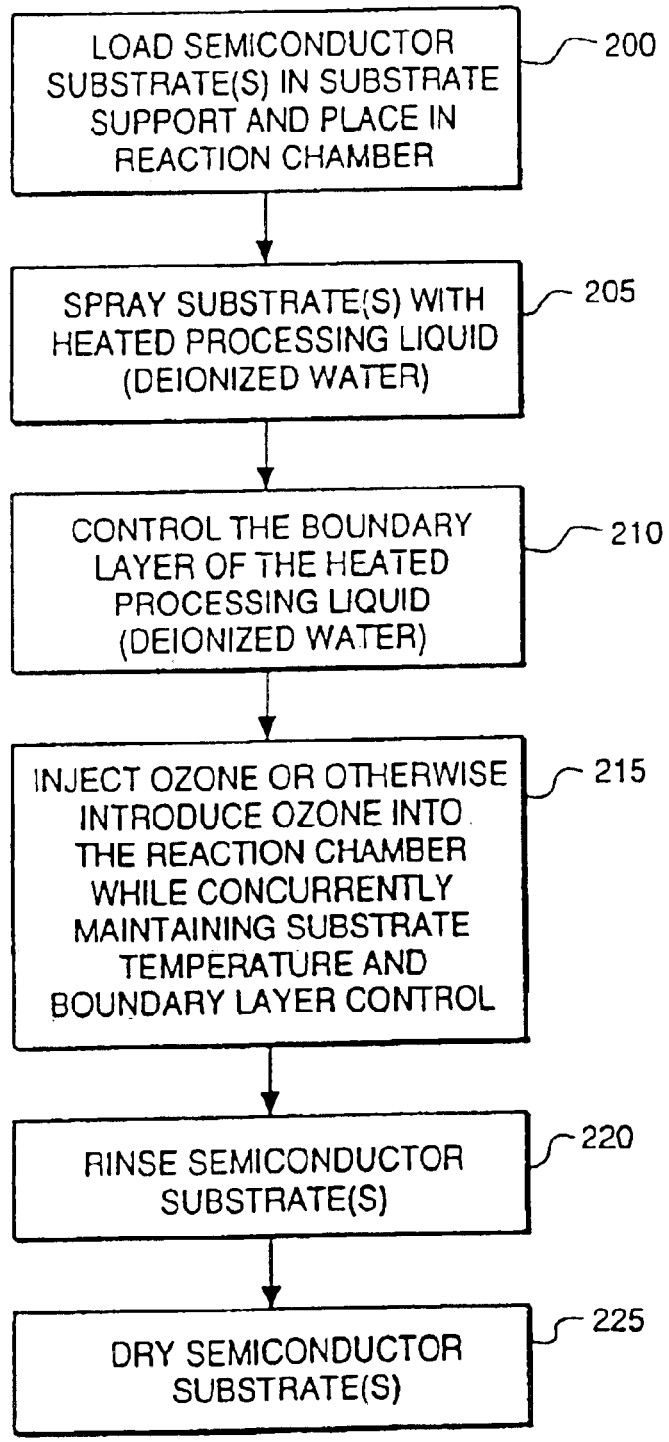
FIG. 3 is a flow diagram illustrating one embodiment of a process flow for treating a semiconductor workplace with a treatment fluid and ozone.

FIG. 3 illustrates one embodiment of a process that may be implemented in the system of FIG. 2 when the system 120 is used, for example, to strip photoresist from the surfaces of semiconductor workpieces. At step 200, the workpieces 20 that are to be stripped are placed in, for example, a Teflon wafer cassette. This cassette is placed in a closed environment, such as in chamber 15. Chamber 15 and its corresponding components may be constructed based on a spray solvent tool platform or spray acid tool platform such as those available from Semitool, Inc., of Kalispell, Mont. Alternatively, the semiconductor workpieces 20 may be disposed in chamber 15 in a carrierless manner, consistent with the automated processing platform design of the MAGNUM® brand semiconductor processing tool available from Semitool, Inc.

At step 205, heated deionized water is sprayed onto the surfaces of the semiconductor workpieces 20. The heated deionized water heats the surfaces of the semiconductor workpieces 20 as well as the enclosed environment of the chamber 15. When the spray is discontinued, a thin liquid film remains on the workpiece surfaces. If the surface is hydrophobic, a surfactant may be added to the deionized water to assist in creating a thin liquid boundary layer on the workpiece surfaces.

The surface boundary layer of deionized water is controlled at step 210 using one or more techniques. For example, the semiconductor workpieces 20 may be rotated about axis 35 by rotor 30 to thereby generate centripetal accelerations that thin the boundary layer. The flow rate of the deionized water may also be used to control the thickness of the surface boundary layer. Lowering of the flow rate results in decreased boundary layer thickness. Still further, the manner in which the deionized water is injected into the chamber 15 may be used to control the boundary layer thickness. Nozzles 40 may be designed to provide the deionized water as micro-droplets thereby resulting in a thin boundary layer.

At step 215, ozone is injected into the fluid flow path 60 during the water spray, or otherwise provided to the internal chamber environment of chamber 15. If the apparatus of FIG. 2 is utilized, the injection of the ozone continues after the spray has shut off. If the workpiece surface begins to dry, a brief spray is preferably activated to replenish the liquid film on the workpiece surface. This ensures that the exposed workpiece surfaces remain wetted at all times and, further, ensures that the workpiece temperature is and remains elevated at the desired reaction temperature. It has been found that a continuous spray of deionized water having a flow rate that is sufficient to maintain the workpiece surfaces at an elevated temperature, and high rotational speeds (i.e., >300 rpm, between 300 and 800 rpm, or even as high as or greater than 1500 rpm) generates a very thin boundary layer which minimizes the ozone diffusion barrier and thereby leads to an enhanced photoresist stripping rate. As such, the control of the boundary layer thickness is used to regulate the diffusion of reactive ozone to the surface of the wafer.

While ozone has a limited solubility in the heated deionized water, the ozone is able to diffuse through the water and react with photoresist at the liquid/resist interface. It is believed that the presence of the deionized water itself further assists in the reactions by hydrolyzing the carbon-carbon bonds of organic deposits, such as photoresist, on the surface of the wafer. The higher temperature promotes the reaction kinetics while the high concentration of ozone in the gas phase promotes diffusion of ozone through the boundary layer film even though the high temperature of the boundary layer film does not actually have a high concentration of dissolved ozone.

After the semiconductor workpieces 20 have been processed through the reactions of the ozone and/or liquid with the materials to the removed, the workpieces are subject to a rinse at 220 and are dried at step 225. For example, the workpieces may be sprayed with a flow of deionized water during the rinse at step 220. They may then be subject to any one or more known drying techniques thereafter at step 225.

Figure 4:
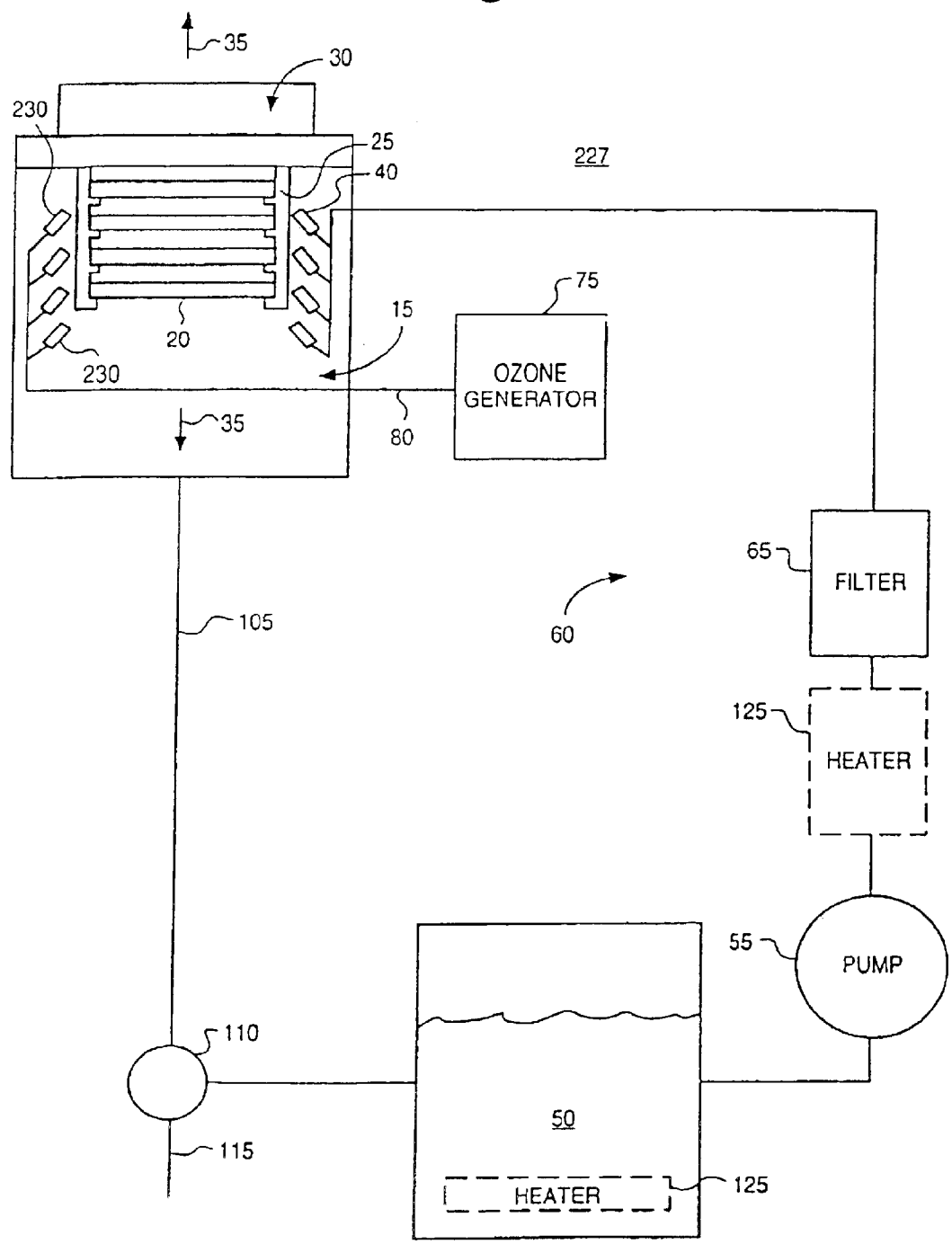
FIG. 4 is a schematic block diagram of an alternative embodiment of the system set forth in FIG. 2 wherein the ozone and treatment fluid are provided to the semiconductor workpiece along different flow paths.

With reference to FIG. 4, there is shown yet a further embodiment of the ozone treatment system 227. In the embodiment of FIG. 4, one or more nozzles 230 are disposed within the treatment chamber 15 to conduct ozone from ozone generator 75 directly into the reaction environment. The heated treatment fluid is provided to the chamber 15 through nozzles 40 that receive the treatment fluid, such as heated deionized water, through a supply line that is separate from the ozone supply line. As such, injection of ozone in fluid path 60 is optional.

Figure 5:
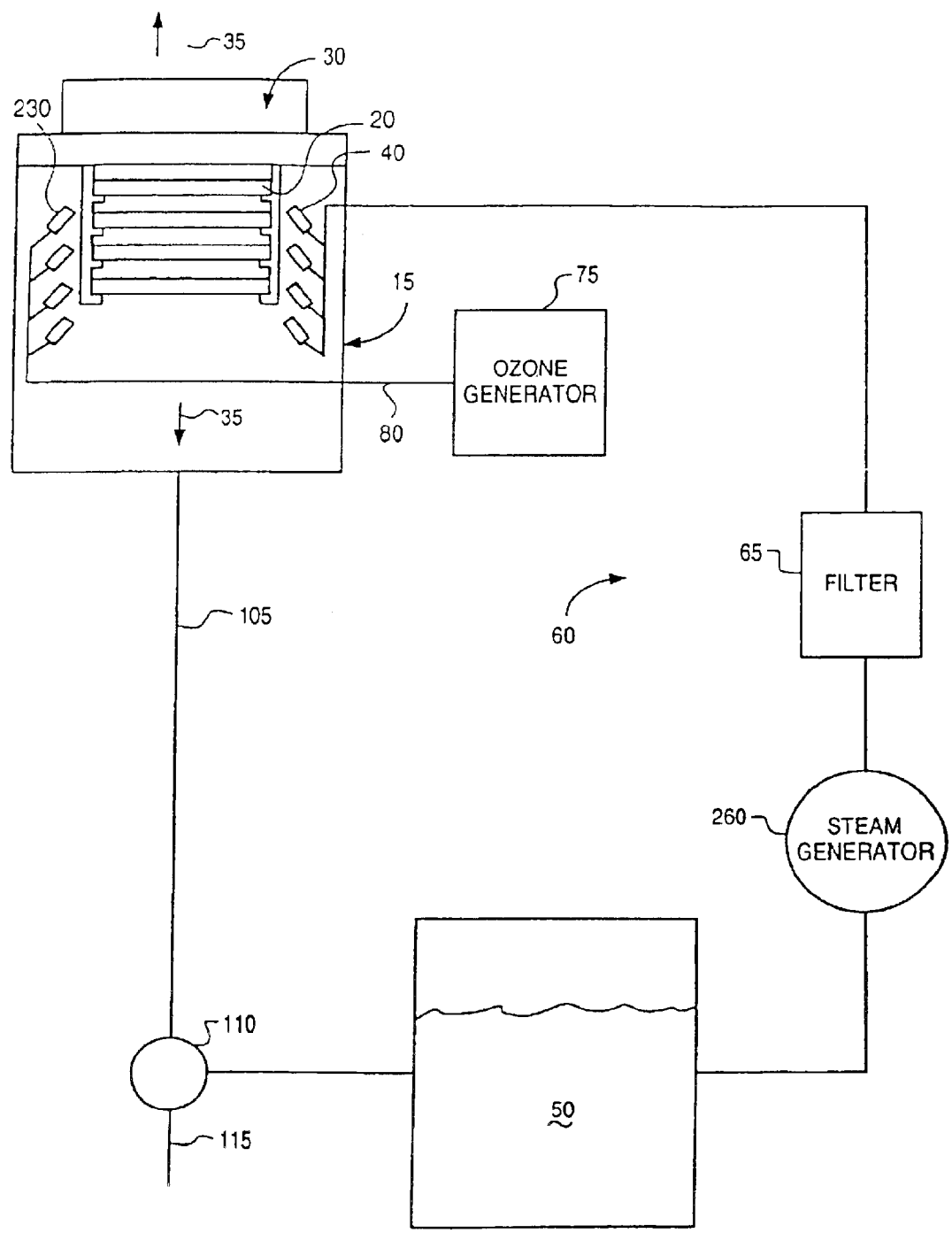
FIG. 5 is a schematic block diagram of an embodiment of an apparatus for treating a semiconductor workpiece in which pressurized steam and ozone are provided in a pressurized chamber containing a semiconductor workpiece.

Another embodiment of an ozone treatment system is shown generally at 250 in FIG. 5. In the system 250, a steam boiler 260 that supplies saturated steam under pressure to the process chamber 15 has replaced the pump mechanism. The reaction chamber 15 is preferably sealed to thereby form a pressurized atmosphere for the reactions. For example, saturated steam at 126 degrees Celsius could be generated by steam boiler 260 and supplied to reaction chamber 15 to generate a pressure of 35 psia therein during the workpiece processing. Ozone may be directly injected into the chamber 15 as shown, and/or may be injected into the path 60 for concurrent supply with the steam. Using the system architecture of this embodiment, it is thus possible to achieve semiconductor workpiece surface temperatures in excess of 100 degrees Celsius, thereby further accelerating the reaction kinetics.

Figure 6:
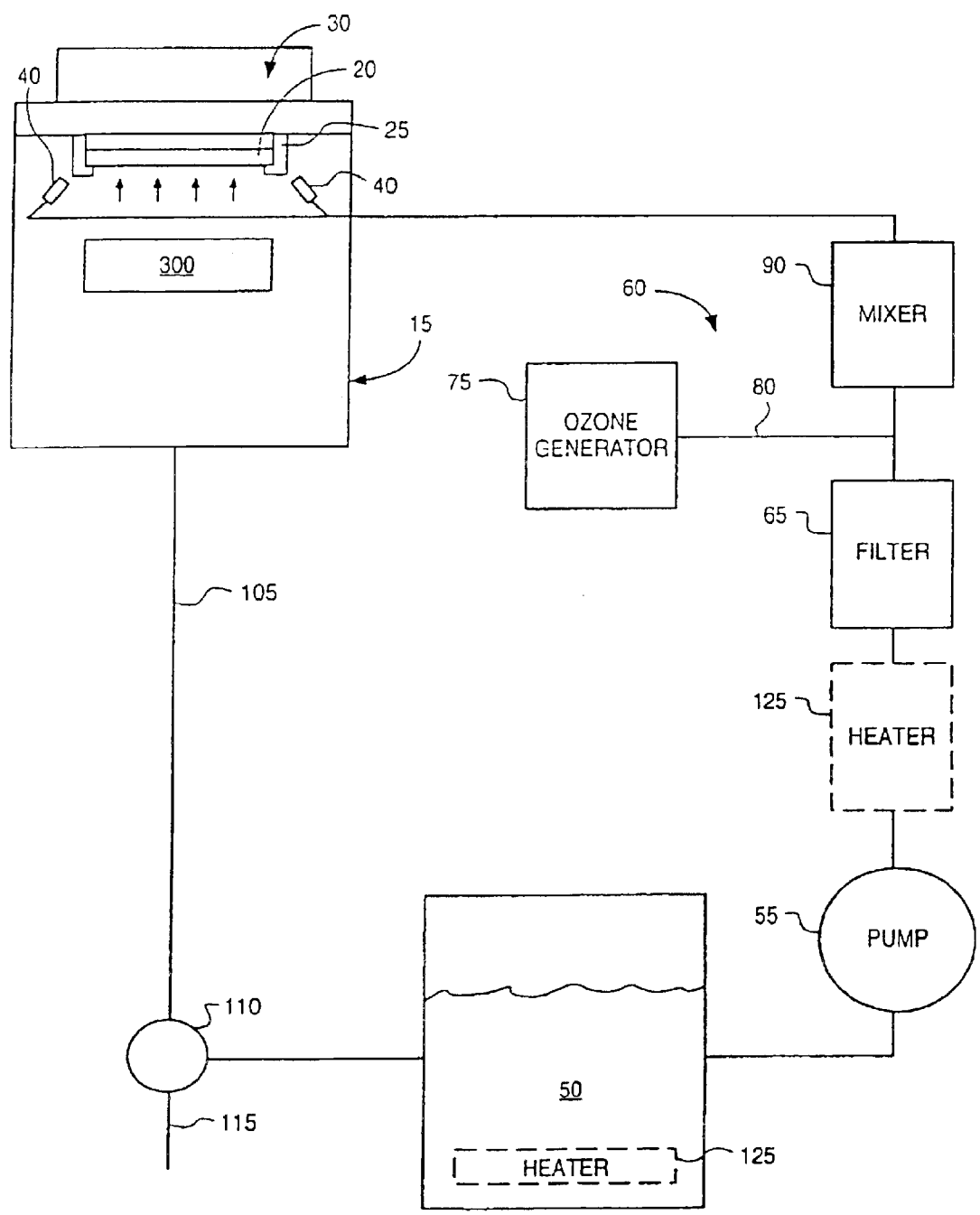
FIG. 6 is a schematic block diagram of an embodiment of an apparatus for treating a semiconductor workpiece in which an ultra-violet lamp is used to enhance the kinetic reactions at the surface of the workpiece.

A still further enhancement that may be made to any one of the foregoing systems is illustrated in FIG. 6. In this embodiment, an ultra-violet lamp 300 is used to irradiate the surface of the semiconductor workpiece 20 during processing. Such irradiation further enhances the reaction kinetics. Although this irradiation technique is applicable to batch semiconductor workpiece processing, it is more easily and economically implemented in the illustrated single wafer processing environment where the workpiece is more easily completely exposed to the UV radiation.

The presently disclosed apparatus and methods may be used to treat workpieces beyond the semiconductor workpieces described above. For example, other workpieces, such as flat panel displays, hard disk media, CD glass, etc, may also be have their surfaces treated using the foregoing apparatus and methods.

Although the preferred treatment liquid for the disclosed application is deionized water, other treatment liquids may also be used. For example, acidic and basic solutions may be used, depending on the particular surface to be treated and the material that is to be removed. Treatment liquids comprising sulfuric acid, hydrochloric acid, and ammonium hydroxide may be useful in various applications.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A method for treating processing a workpiece, comprising the steps of:
   loading the workpiece into a chamber;
   supplying steam into the chamber;
   allowing at least some of the steam to condense as a liquid on a surface of the workpiece, to form a layer of liquid on the workpiece, and with the condensing steam heating the workpiece; and
   introducing ozone gas into the chamber with the ozone gas moving via diffusion, through the liquid layer, and to a liquid/solid interface at the surface of the workpiece, where the ozone chemically reacts, to process the workpiece.

2. The method of claim 1 wherein the steam supplied into the chamber comprises saturated steam.

3. The method of claim 1 further comprising the step of rotating the workpiece to control a thickness of the layer of liquid.

4. The method of claim 1 wherein the step of supplying steam into the chamber comprises spraying the steam into the chamber.

5. The method of claim 1 wherein the steam heats the surface of the workpiece to a temperature greater than 100° C.

6. The method of claim 1 further comprising the step of mixing the steam and the ozone before supplying them into the chamber.

7. The method of claim 1 further comprising the step of adding a surfactant to the steam before supplying the steam into the chamber.

8. The method of claim 1 further comprising irradiating the workpiece with ultraviolet light to enhance a reaction of ozone at the surface of the workpiece.

9. The method of claim 1 further comprising the steps of rinsing and drying the workpiece.

10. A method for treating a workpiece, comprising the steps of:
    placing the workpiece into a chamber;
    introducing steam into the chamber;
    heating the workpiece with the steam;
    allowing at least some steam to condense on a surface of the workpiece to form a heated liquid boundary layer on the surface of the workpiece with the condensing steam contributing to heating the workpiece;
    introducing ozone gas into the chamber;
    diffusing the ozone gas through the heated liquid boundary layer; and
    reacting the ozone at the surface of the workpiece.

11. The method of claim 10 wherein the steam is introduced into the chamber at a temperature greater than 125° C.

12. The method of claim 10 wherein the steam heats the surface of the workpiece to a temperature greater than 100° C.

13. The method of claim 10 further comprising the step of mixing the steam and the ozone before introducing them into the chamber.

14. The method of claim 10 further comprising the step of rotating the workpiece to control a thickness of the heated liquid boundary layer.

15. A method for processing a workpiece to remove material from a surface of the workpiece, comprising the steps of:
    condensing steam on the workpiece surface that is to be treated to form a liquid boundary layer that allows diffusion of ozone therethrough for reaction with the material at a liquid-solid interface between the liquid boundary layer and the material, with the steam adding heat to the workpiece and assisting in maintaining the workpiece at an elevated temperature; and
    introducing gaseous ozone to the environment around the workpiece under conditions in which the ozone diffuses through the boundary layer and reacts with the material.

16. The method of claim 15 further including the step of rotating the workpiece to assist in forming the liquid boundary layer.

17. The method of claim 15 further including the step spraying the steam towards the workpiece surface.

18. The method of claim 15 wherein the ozone gas reacts with the material, and causes removal of the material at a rate of at least 2500 angstroms per minute.

19. The method of claim 15 further including the step of providing sulfuric acid, hydrochloric acid, or ammonium hydroxide into the liquid boundary layer.

20. A method for treating a workpiece, comprising the steps of:
    loading the workpiece into a chamber;
    pressurizing the chamber;
    supplying steam into the pressurized chamber;

allowing at least some of the steam to condense as a liquid on a surface of the workpiece, to form a layer of liquid on the workpiece; and introducing ozone gas into the chamber.

21. A method for treating a workpiece, comprising the steps of:

loading the workpiece into a chamber;

adding at least one of ammonium hydroxide, an acid hydroxide, sulfuric acid, hydrochloric acid, and hydrofluoric acid to steam;

supplying the steam into the, chamber;

allowing at least some of the steam to condense as a liquid on a surface of the workpiece, to form a layer of liquid on the workpiece; and introducing ozone gas into the chamber.

22. A method for treating a workpiece, comprising the steps of:

placing the workpiece into a chamber;

introducing steam into the chamber;

heating the workpiece with the steam;

allowing steam to condense on a surface of the workpiece to form a heated liquid boundary layer on the surface of the workpiece;

introducing ozone gas into the chamber;

diffusing the ozone gas through the heated liquid boundary layer; and reacting the ozone at the surface of the workpiece wherein the chamber is pressurized to at least 35 psia.

23. A method for processing a workpiece, comprising the steps of:

loading the workpiece into a chamber;

providing steam into the chamber;

allowing at least some of the steam to condense as a liquid on a surface of the workpiece, to form a layer of liquid on the workpiece and with the condensing steam heating the surface of the workpiece;

rotating the workpiece within the chamber; and providing ozone gas into the chamber, with the ozone gas diffusing through the layer of liquid and chemically reacting at the surface of the workpiece, to process the workpiece.

24. The method of claim 23 further comprising the step of providing steam into the chamber by spraying the steam towards the workpiece.

25. The method of claim 23 wherein the ozone gas is provided as a dry gas into the chamber and the steam is provided into the chamber separately from the ozone.

26. A method for processing a workpiece, comprising the steps of:

loading the workpiece into a chamber;

supplying steam into the chamber;

allowing at least some of the steam to condense as a liquid on a surface of the workpiece, to form a layer of liquid on the workpiece, and with the condensing steam heating the workpiece; and introducing ozone as a dry gas into the chamber separately from the steam.

* * * * *